US012608529B2

(12) United States Patent (10) Patent No.: US 12,608,529 B2
Lee et al. (45) Date of Patent: Apr. 21, 2026

(54) SYSTEM AND METHOD FOR OPTIMIZING INTEGRATED CIRCUIT LAYOUT BASED ON NEURAL NETWORK

(71) Applicant: ASICLAND Co., Ltd., Suwon-si (KR)

(72) Inventors: Jong Min Lee, Suwon-si (KR); Chang Eun Jang, Seoul (KR)

(73) Assignee: ASICLAND Co., Ltd., Suwon-si (KR)

( * ) Notice: Subject to any disclaimer, the term of this patent is extended or adjusted under 35 U.S.C. 154(b) by 679 days.

(21) Appl. No.: 18/062,922

(22) Filed: Dec. 7, 2022

(65) Prior Publication Data

US 2023/0186007 A1 Jun. 15, 2023

(30) Foreign Application Priority Data

Dec. 10, 2021 (KR) ........................ 10-2021-0176525

(51) Int. Cl.
 *G06F 30/392* (2020.01)
 *G06F 30/31* (2020.01)
 *G06F 30/323* (2020.01)
 *G06N 3/092* (2023.01)
(52) U.S. Cl.
 CPC ............ *G06F 30/392* (2020.01); *G06F 30/31* (2020.01); *G06F 30/323* (2020.01); *G06N 3/092* (2023.01)
(58) Field of Classification Search
 CPC .................................................. G06F 30/392
 USPC ........................................................ 716/132
 See application file for complete search history.

(56) References Cited

U.S. PATENT DOCUMENTS

2020/0175216 A1* 6/2020 Ho ......................... G06N 3/045

FOREIGN PATENT DOCUMENTS

KR 10-2019-0024723 A 3/2019
KR 10-2279473 B1 7/2021

* cited by examiner

*Primary Examiner* — Eric D Lee
(74) *Attorney, Agent, or Firm* — Studebaker Brackett PLLC

(57) ABSTRACT

Disclosed are a system and a method for optimizing integrated circuit layout based on neural network. The system according to an exemplary embodiment of the present disclosure includes: a placement information generation unit generating placement information indicating placement positions of circuit blocks; a placement information filtering unit predicting a minimum substrate area required for placing the circuit blocks according to the generated placement information and when a predicted minimum substrate area does not correspond to a predetermined reference area range, discarding the generated placement information and requesting the placement information generation unit to generate subsequent placement information; and an EDA tool control unit providing the generated placement information to the EDA tool when the predicted minimum substrate area corresponds to the reference area range, and controlling the EDA tool to measure consumption power, performance, and an area of the target integrated circuit based on the generated placement position information.

7 Claims, 7 Drawing Sheets

FIG. 9

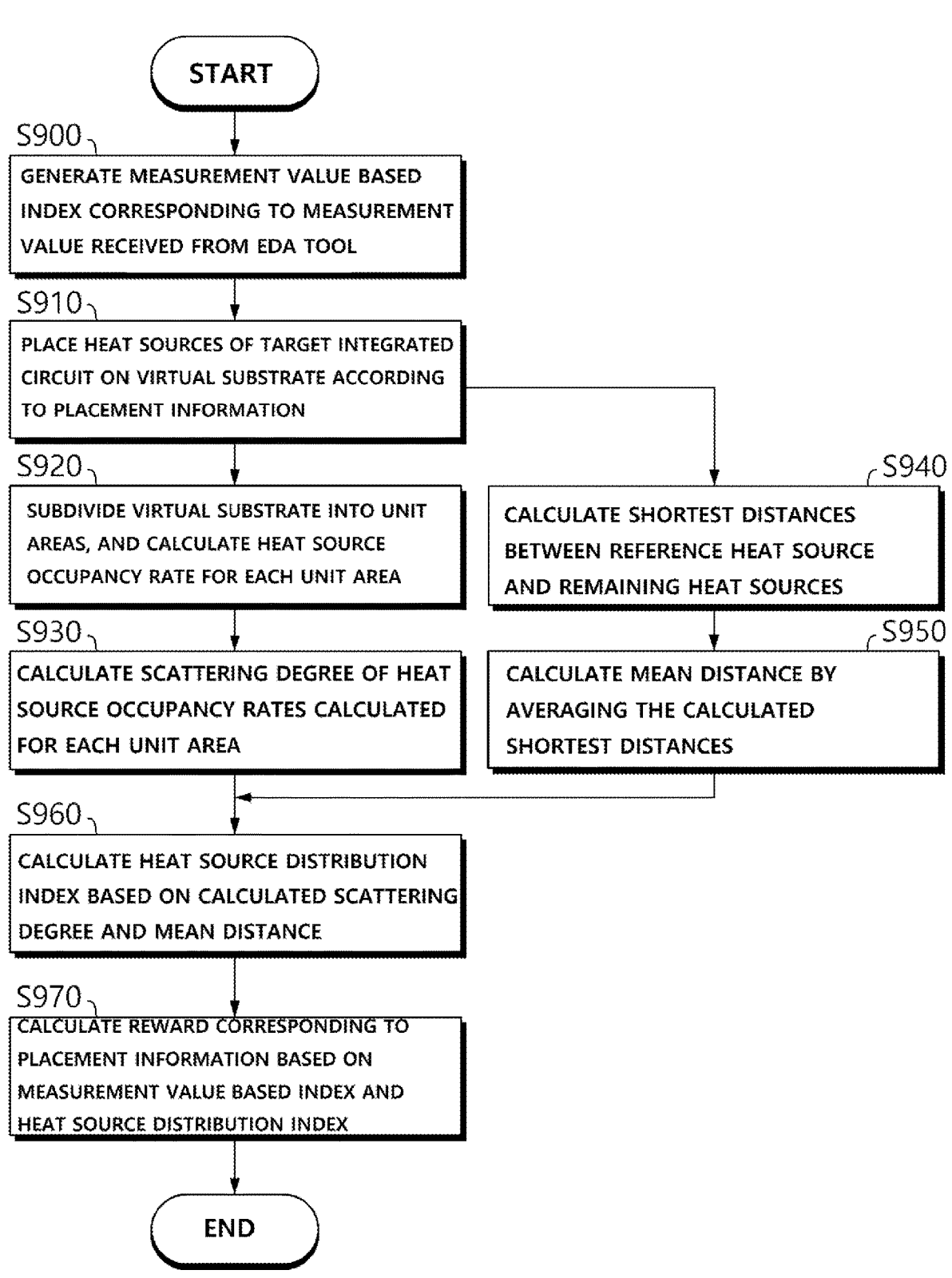

START

S900
GENERATE MEASUREMENT VALUE BASED INDEX CORRESPONDING TO MEASUREMENT VALUE RECEIVED FROM EDA TOOL

S910
PLACE HEAT SOURCES OF TARGET INTEGRATED CIRCUIT ON VIRTUAL SUBSTRATE ACCORDING TO PLACEMENT INFORMATION

S920
SUBDIVIDE VIRTUAL SUBSTRATE INTO UNIT AREAS, AND CALCULATE HEAT SOURCE OCCUPANCY RATE FOR EACH UNIT AREA

S940
CALCULATE SHORTEST DISTANCES BETWEEN REFERENCE HEAT SOURCE AND REMAINING HEAT SOURCES

S930
CALCULATE SCATTERING DEGREE OF HEAT SOURCE OCCUPANCY RATES CALCULATED FOR EACH UNIT AREA

S950
CALCULATE MEAN DISTANCE BY AVERAGING THE CALCULATED SHORTEST DISTANCES

S960
CALCULATE HEAT SOURCE DISTRIBUTION INDEX BASED ON CALCULATED SCATTERING DEGREE AND MEAN DISTANCE

S970
CALCULATE REWARD CORRESPONDING TO PLACEMENT INFORMATION BASED ON MEASUREMENT VALUE BASED INDEX AND HEAT SOURCE DISTRIBUTION INDEX

END

SYSTEM AND METHOD FOR OPTIMIZING INTEGRATED CIRCUIT LAYOUT BASED ON NEURAL NETWORK

CROSS-REFERENCE TO RELATED APPLICATIONS

This application claims priority to and the benefit of Korean Patent Application No. 10-2021-0176525 filed in the Korean Intellectual Property Office on Dec. 10, 2021, the entire contents of which are incorporated herein by reference.

TECHNICAL FIELD

The present invention relates to a system and a method for optimizing an integrated circuit layout based on a neural network, and more particularly, to a system and a method for optimizing an integrated circuit layout based on a neural network, which optimize a layout of a target integrated circuit in link with an EDA tool having design and evaluation functions of an integrated circuit.

BACKGROUND ART

In general, the design of an integrated circuit implemented as a semiconductor chip includes time and cost-intensive processes such as a logical synthesis process, a layout design process including placement and routing, a physical synthesis process, etc.

In particular, a layout design of the integrated circuit requiring ultra-compactization and high integration, such as system on chip (SoC), application specific integrated circuit (ASIC), field-programmable gate array (FPGA), etc. should be performed based on knowledge and experience of an experienced engineer, and since the layout is optimized by repeating verification of the layout design and a design change process through a simulation using computer aided design (CAD) software or an electronic design automation (EDA) tool, a lot of time and cost are required.

Therefore, as disclosed in Korean Patent Unexamined Publication No. 10-2019-0024723, technologies of automating some design processes of the integrated circuit by using a computer are introduced. However, in the conventional technologies, since the engineer should perform computer setting by using the knowledge and experience thereof upon an actual layout design of the integrated circuit, and a task of changing the computing setting should be repeated by referring a simulation result, a lot of time and cost are still required in order optimize the integrated circuit layout and there is a variation in design quality according to an ability of the engineer.

As Korean Patent Registration No. 10-2279473, the conventional technology uses machine learning for the design of the integrated circuit, but the conventional technology aims at designing the layout having a specific area utilization, so an optimized layout design cannot be provided by considering all of consumed power, performance, and an area of the integrated circuit, and as a result, a layout design showing a consumed power property or a performance property which is not suitable for a design intention, a purpose, or an applied environment of the integrated circuit can be provided.

The conventional technology cannot present a layout optimization method which can fundamentally alleviate a heat generation phenomenon of the integrated circuit that causes malfunction or life shortening of the integrated circuit.

SUMMARY

The present invention has been made in an effort to provide a system for optimizing an integrated circuit layout based on a neural network, which generates placement information by automatically placing circuit blocks included in a design target integrated circuit through a neural network model learned based on a reinforcement learning algorithm, and provides a simulation result corresponding to the placement information jointly with the placement information in link with an EDA tool to reduce time and cost for optimizing an integrated circuit layout design and provide a layout design having a constant quality regardless of an ability of an engineer.

The present invention has been made in an effort to provide a method for optimizing an integrated circuit layout based on a neural network, which preferentially predicts a minimum substrate area 'required'? for placing the circuit blocks according to the placement information before performing a simulation corresponding to the placement information through the EDA tool, and discards the placement information and generates subsequent placement information when the minimum substrate area does not correspond to a predetermined reference area range to reduce unnecessary time and cost required for the simulation and improve the quality of the layout design.

An exemplary embodiment of the present invention provides a system for optimizing an integrated circuit layout based on a neural network which interlocks with an electronic design automation (EDA), which may include: a design information acquisition unit parsing a netlist file of a target integrated circuit and acquiring design information of the target integrated circuit; a circuit block decision unit deciding circuit blocks which correspond to the placement position adjustment target and each include at least one element or cell based on the acquired design information; a placement information generation unit generating placement information indicating placement positions of the circuit blocks by using a neural network model learned to automatically place the circuit blocks based on a reinforcement learning algorithm; a placement information filtering unit predicting a minimum substrate area required for placing the circuit blocks according to the generated placement information and when the predicted minimum substrate area does not correspond to a predetermined reference area range, discarding the generated placement information and requesting the placement information generation unit to generate subsequent placement information; an EDA tool control unit providing the generated placement information to the EDA tool when the predicted minimum substrate area corresponds to the reference area range, and controlling the EDA tool to measure consumption power, performance, and an area of the target integrated circuit based on the generated placement position information; a first index generation unit generating a consumption power index, a performance index, and an area index based on measurement values for the consumption power, performance, and area of the target integrated circuit, which are measured through the EDA tool; and a reward providing unit calculating a reward corresponding to the generated placement information based on a first reward component acquired by applying a first weight to the consumption power index, a second reward component acquired by applying a second weight to the performance index, and a third reward component acquired by applying a third weight to the area index, and providing the calculated reward to the neural network model.

In an exemplary embodiment, the optimizing system may further include an optimization information storage unit associating, when the measurement value for the consumption power of the target integrated circuit measured through the EDA tool, the measurement value for the performance, and the measurement value for the area satisfy all a predetermined consumption power condition, a predetermined performance condition, and a predetermined area condition, respectively, the measurement values measured through the EDA tool and the reward corresponding to the generated placement information with the generated placement information, and storing the associated the measurement values and the reward, and the generated placement information.

In an exemplary embodiment, the placement information generation unit may be configured to generate subsequent placement information by using the neural network model when the number of placement information stored in the optimization information storage unit is less than the predetermined reference number.

Another exemplary embodiment of the present invention provides a method for optimizing an integrated circuit layout based on a neural network which interlocks with an electronic design automation (EDA), which may include: step A of parsing a netlist file of a target integrated circuit and acquiring design information of the target integrated circuit; step B of deciding circuit blocks which correspond to the placement position adjustment target and each include at least one element or cell based on the design information; step C of generating placement information indicating placement positions of the circuit blocks by using a neural network model learned to automatically place the circuit blocks based on a reinforcement learning algorithm; step D of predicting a minimum substrate area required for placing the circuit blocks according to the generated placement information and when the predicted minimum substrate area does not correspond to a predetermined reference area range, discarding the generated placement information and generating subsequent placement information by using the neural network model; step E of providing the generated placement information to the EDA tool when the predicted minimum substrate area corresponds to the reference area range, and controlling the EDA tool to measure consumption power, performance, and an area of the target integrated circuit based on the generated placement position information; step F of generating a consumption power index, a performance index, and an area index based on measurement values for the consumption power, performance, and area of the target integrated circuit, which are measured through the EDA tool; and step G of calculating a reward corresponding to the generated placement information based on a first reward component acquired by applying a first weight to the consumption power index the computer system, a second reward component acquired by applying a second weight to the performance index, and a third reward component acquired by applying a third weight to the area index, and providing the calculated reward to the neural network model.

In an exemplary embodiment, the method may further include step H of associating, when the measurement value for the consumption power of the target integrated circuit measured through the EDA tool, the measurement value for the performance, and the measurement value for the area satisfy all a predetermined consumption power condition, a predetermined performance condition, and a predetermined area condition, respectively in step E, the measurement values measured through the EDA tool and the reward corresponding to the generated placement information with the generated placement information, and storing the associated the measurement values and the reward, and the generated placement information.

In an exemplary embodiment, the method may further include, after step H, generating the subsequent placement information by using the neural network model, and repeating steps D to H when the number of placement information stored in the computer system is less than the predetermined reference number.

Exemplary embodiments of the present invention may be implemented by using a computer readable recording medium having a computer program for executing the operation or the method, which is recorded therein.

According to the present invention, placement information is generated by automatically placing circuit blocks included in a design target integrated circuit through a neural network model learned based on a reinforcement learning algorithm, and a simulation result corresponding to the placement information is provided jointly with the placement information in link with an EDA tool to reduce time and cost for optimizing an integrated circuit layout design and provide a layout design having a constant quality regardless of an ability of an engineer.

A minimum substrate area required for placing the circuit blocks according to the placement information is preferentially predicted before performing a simulation corresponding to the placement information through the EDA tool, and the placement information is discarded and subsequent placement information is generated when the minimum substrate area does not correspond to a predetermined reference area range to reduce unnecessary time and cost required for the simulation and improve the quality of the layout design.

Reinforcement learning for the neural network model is reperformed by a method of calculating and providing a reward considering all of consumed power, performance, and an area of a target integrated circuit in response to an action of the neural network model to provide a layout design which satisfies all of a consumed power property, a performance property, and an area property required according to the design intention, purpose, or applied environment of the integrated circuit, and further improve the quality of the layout design.

The reward provided to the neural network model is calculated by reflecting distribution states of elements, cells, or circuit blocks corresponding to a heat source of the target integrated circuit to provide a layout design which fundamentally alleviates a heat generation phenomenon of the integrated circuit.

It will be apparently understood by those skilled in the art that various exemplary embodiments according to the present invention can solve various technical problems not mentioned above from the following description.

BRIEF DESCRIPTION OF THE DRAWINGS

FIG. 9 is a flowchart illustrating a reward calculation process the method for optimizing an integrated circuit layout according to an exemplary embodiment of the present invention.

DETAILED DESCRIPTION

Hereinafter, exemplary embodiments according to the present invention will be described in detail with reference to the accompanying drawings in order to clarify the solving means corresponding to the technical problem of the present invention. However, in the description of the present invention, if the description of the related known technology makes the point of the present invention be obscure, a description thereof may be omitted. In addition, terms used in this specification as terms which are defined in consideration of functions in the present invention may vary depending on the intention of a designer, a manufacturer, etc., or a usual practice. Accordingly, terms to be described below need to be defined based on contents throughout this specification.

Figure 1:
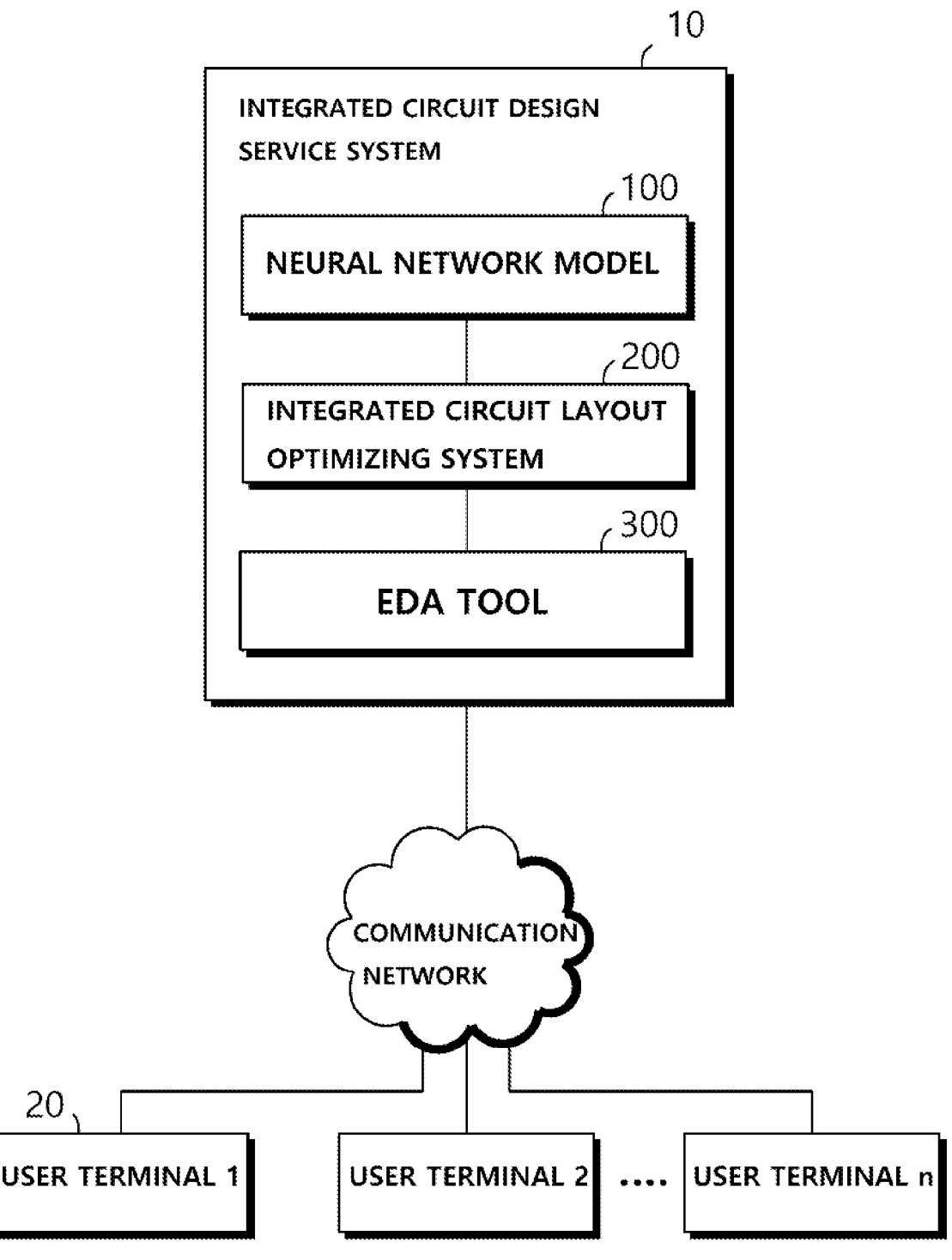
FIG. 1 is a diagram illustrating an integrated circuit design service system according to an exemplary embodiment of the present invention.

FIG. 1 illustrates an integrated circuit design service system 10 according to an exemplary embodiment of the present invention.

As illustrated in FIG. 1, the integrated circuit design service system 10 may be configured to perform data communication with a user terminal 20 of Fabless or Design House related to semiconductor integrated circuit manufacturing through a communication network, and provide an integrated circuit design tool to the Fabless or the Design House. To this end, the integrated circuit design service system 10 may be configured in the form of a cloud server, and may include a neural network model 100, an integrated circuit layout optimizing system 200, and an EDA tool 300.

The neural network model 100 as a kind of artificial intelligence model implemented based on a neural network may be learned to perform an action of automatically placing circuit blocks of an integrated circuit logically designed based on a reinforcement learning algorithm.

That is, the neural network model 100 may be configured to automatically place various circuit blocks included in the integrated circuit in a virtual space corresponding to the substrate. In this case, circuit blocks of the integrated circuit corresponding to placement position adjustment targets may be decided according to a physical criterion or a function criterion, and each circuit block may include at least one component or cell.

The neural network model 100 may be implemented by software or a combination of software and hardware for executing the software.

In the present invention, the reinforcement learning may be performed by a method in which when a placement design of a specific integrated circuit is decided by the neural network model 100, a reward corresponding to the decided placement design is fed back to make the neural network model 100 to learn to decide an optimal placement design.

Meanwhile, as a method in which the neural network model 100 decides an action thereof, a value-based decision method, a policy-based decision method, or a value and policy-based decision method may be used.

The value-based decision method is a method for deciding an action giving a best value in each state based on a value function. The value-based decision method may adopt Q-learning, a Deep Q-Network (DQN) algorithm, etc.

The policy-based decision method is a method for deciding the action based on a final reward and a policy function without the value function. The policy-based decision method may adopt a proximal policy gradient (PPO) algorithm.

The value and policy-based decision method is a method for deciding the action by evaluating the action based on the value function when the action is decided based on the policy function. For example, the value and policy-based decision method may adopt a Soft Actor-Critic algorithm.

For example, the proximal policy gradient (PPO) algorithm having an advantage of being capable of distributed learning may be applied to the neural network model 100.

The integrated circuit layout optimizing system 200 may be configured to provide information on states of a target integrated circuit or circuit blocks of the target integrated circuit to the neural network model 100, and when a placement design of the target integrated circuit is decided by the neural network model 100, calculate a reward corresponding to the placement design and feed back the calculated reward to the neural network model 100. To this end, the integrated circuit layout optimizing system 200 may be configured to interlock with the EDA tool 300. The integrated circuit layout optimizing system 200 may be implemented as a kind of computer system in which software and hardware are combined.

The EDA tool 300 may be configured to execute a simulation for the target integrated circuit based on the placement design decided by the neural network model 100 according to the control of the integrated circuit layout optimizing system 200 to measure consumption power, performance, and an area of the integrated circuit. To this end, the EDA tool 300 may include one or two or more of Model Architect®, Saber®, System Studio®, Designware®, Custom Compiler®, Design Compiler®, Physical Compiler®, Test Compiler®, Power Compiler®, Tetramax®, Formality®, Primetime®, VCS®, Astro®, and IC Compiler® which are software products of Synopsys Inc. The EDA tool 300 may be implemented by software or a combination of software and hardware for executing the software.

The integrated circuit layout optimizing system 200 may the reinforcement learning for the neural network model 100 by a method for calculating the reward corresponding to the placement design based on measurement values measured by the EDA tool 300 and providing the calculated reward to the neural network model 100.

Figure 2:
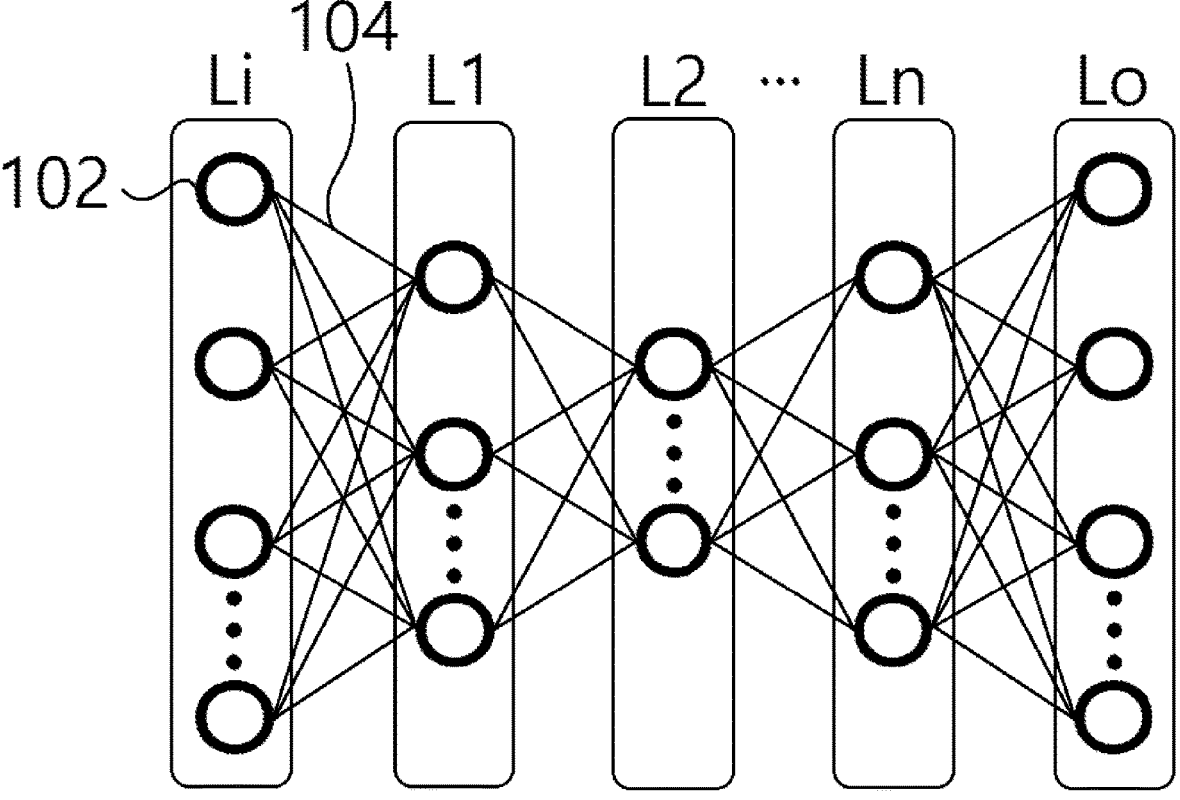
FIG. 2 is a diagram illustrating an example of a neural network model learned based on a reinforcement learning algorithm.

FIG. 2 is a diagram illustrating an example of a neural network model 100 learned based on a reinforcement learning algorithm.

As illustrated in FIG. 2, the neural network model 100 may be configured by a deep neural network (DNN) including an input layer Li, an output layer Lo, and a plurality of hidden layers L1 to Ln between the input layer Li and the output layer Lo.

The DNN may include multiple neurons (or nodes) 102 that performs a specification operation for respective layers, and the neuron 102 included in any one layer may be connected to one or two or more neurons included in an adjacent layer through a link 104. A weight may be assigned to respective links 104 connecting the neurons, and an operation value delivered through the link 104 may be decided by the weight assigned to the link 104. A property of the DNN may be decided according to the number of neurons constituting a network, a connection relationship between the neurons, and the weight assigned to each link connecting the neurons.

The DNN may be classified into a Convolutional Neural Network (CNN), a Recurrent Neural Network (RNN), a Deep Belief Network (DBN), a Graph Neural Network (GNN), a deep autoencoder, etc., according to the applied algorithm.

The neural network model 100 should be able to accurately appreciate integrated circuit design information such as netlist in order to optimize placement positions of circuit blocks included in a logically synthesized integrated circuit, in particular, information such as the property of the placement target circuit block and a connection relationship with the other circuit block, a placement position of the other circuit block, etc., should be able to be quickly processed. To this end, the Graph Neural Network (GNN) which may efficiently process a graph structure for macro, standard cell, wire, etc., of the integrated circuit may be applied to the neural network model 100.

Figure 3:
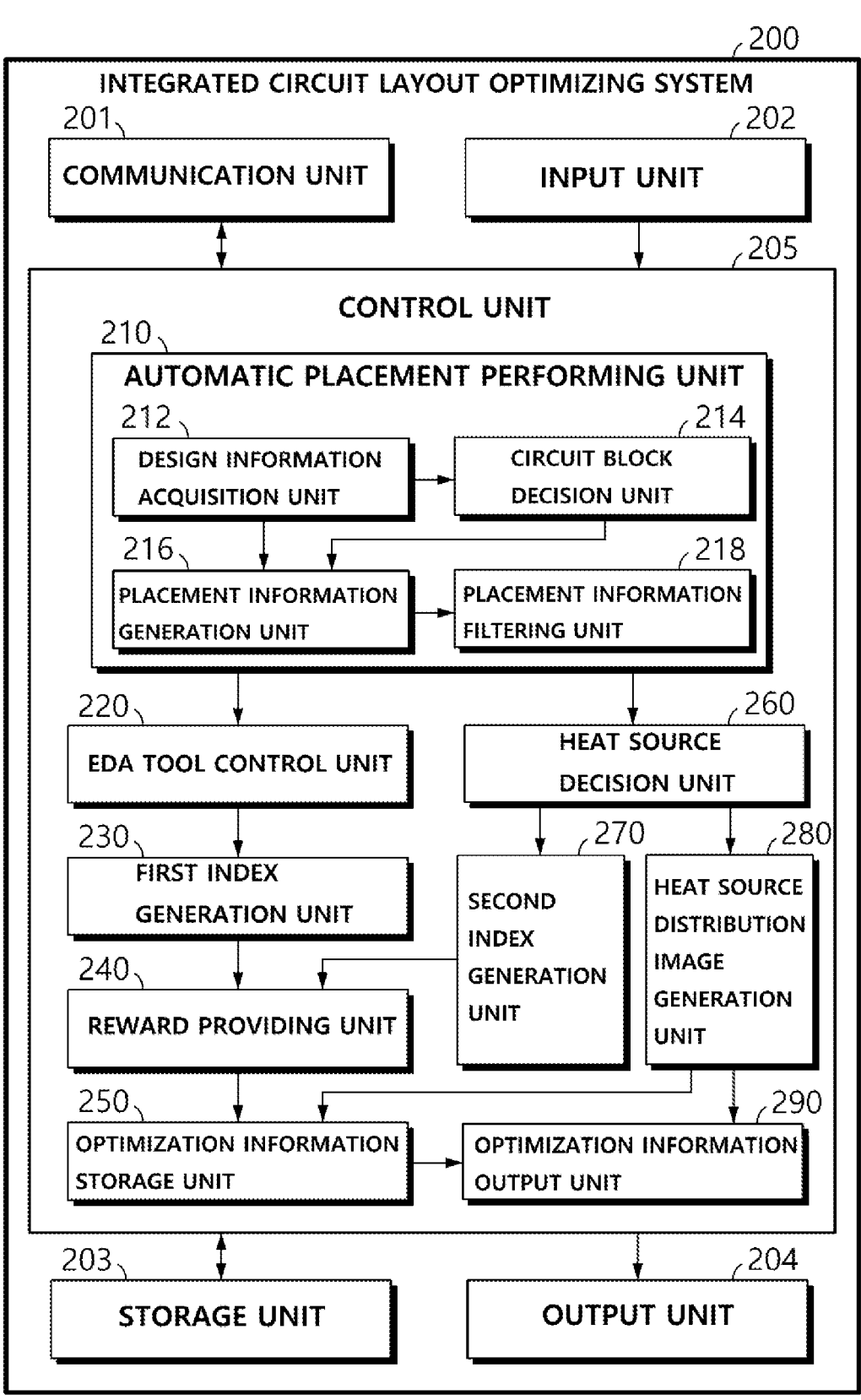
FIG. 3 is a block diagram illustrating a system for optimizing an integrated circuit layout according to an exemplary embodiment of the present invention.

FIG. 3 illustrates a block diagram of an integrated circuit layout optimizing system 200 according to an exemplary embodiment of the present invention.

As illustrated in FIG. 3, the integrated circuit layout optimizing system 200 may include a communication unit 201, an input unit 202, a storage unit 203, an output unit 204, a control unit 205, etc.

The communication unit 201 may be configured to receive and deliver, to the control unit 205, data transmitted from other communication devices such as a sever or a computer through a wired/wireless communication network, or transmit data generated or processed by the control unit 205 to other communication devices. To this end, the communication unit 201 may include a communication modem that performs wired/wireless communication. In this case, the communication unit 201 may include a WiFi communication module performing wireless communication with a peripheral access point (AP) or an LTE communication module, a 5G communication module, etc., performing direct communication with other communication devices. Further, the communication unit 201 may include a USB port, a wired LAN port, or various communication ports to which other data transmission cables are connected.

The input unit 202 may be configured to receive a command of a user, data, and various other external information. To this end, the input unit 202 may include various input devices such as a keyboard, a mouse, a manipulation button, or a touch panel.

The storage unit 203 may be configured to store and manage data required for operating the integrated circuit layout optimizing system 200. To this end, the storage unit 203 may selectively include various storage media including a ROM, a RAM, an EEPROM, a register, a flash memory, a CD-ROM, a magnetic tape, a hard disk, a floppy disk, an optical data recording device, etc.

The output unit 204 may be configured to visually or auditively output data or information. To this end, the output unit 204 may include an image display device such as a display, a monitor, etc., a sound generation device such as a speaker, a printer, etc.

The control unit 205 may be configured to control an overall operation of the integrated circuit layout optimizing system 200, and in particular, interlock with the EDA tool 300 and provide an optimized layout design of the target integrated circuit based on the neural network model 100.

To this end, the control unit 205 may selectively include hardware such as a universal processor for executing control logic, Application-Specific Integrated Circuit (ASIC), other chipsets, logic circuits, registers, a memory, etc. The control unit 205 may be configured by a combination of hardware such as a processor and software such as a computer program. That is, the control logic of the control unit 205 may be configured by the computer program and stored in a self-memory of the control unit 205 or the storage unit 203, and the stored computer program may be configured to be executed through the hardware of the control unit 205.

The control unit 205 may include an automatic placement performing unit 210, an EDA tool control unit 220, a first index generation unit 230, a reward providing unit 240, and an optimization information storage unit 250 as detailed components which are functionally distinguished, and according to an embodiment, may further include a heat source decision unit 260, a second index generation unit 270, a heat source distribution image generation unit 280, an optimization information output unit 290, etc. The detailed components of the control unit 205 may be configured by the combination of hardware such as the processor, the memory, etc., and software such as the computer program.

Hereinafter, functions and operations of the detailed components of the control unit 205 will be described in detail.

The automatic placement performing unit 210 may be configured to place the circuit blocks included in the target integrated circuit by using the neural network model 100 learned to automatically place the circuit blocks included in the integrated circuit based on the reinforcement learning algorithm, and generate placement information indicating the placement position. To this end, the automatic placement performing unit 210 may include a design information acquisition unit 212, a circuit block decision unit 214, a placement information generation unit 216, and a placement information filtering unit 218.

The design information acquisition unit 212 may be configured to acquire design information of the target integrated circuit by parsing a netlist file of the target integrated circuit. In this case, the design information acquisition unit 212 may receive the netlist file of the target integrated circuit from the user terminal 20 or the EDA tool 300.

The netlist corresponds to logical design information including information on properties, mutual connection relationships, etc., of elements or cells constituting the integrated circuit. Since the netlist is generally stored as a file of an edif format, the netlist file should be parsed in order to acquire design information which may be appreciated by the neural network model 100. The design information acquisition unit 212 may acquire design information including meta information such as the total number of elements and the number of wires connecting the elements as well as information on an element specific property such as the size, an electrical property, the number of ports, etc., of the element included in the target integrated circuit and the connection relationship between the elements through parsing for the netlist file of the target integrated circuit.

The circuit block decision unit 214 may be configured to decide circuit blocks which correspond to the placement position adjustment target and each include at least one element or cell based on the acquired design information. In this case, the circuit blocks of the target integrated circuit may be decided according to a physical criterion or a function criterion, or also decided according to setting of the user.

The placement information generation unit 216 may be configured to control the neural network model 100 to automatically place the circuit blocks included in the target integrated circuit, and generate placement information indicating the placement positions of the circuit blocks automatically placed by the neural network model 100.

To this end, the placement information generation unit 216 may provide, to the neural network model 100, information on states of the target integrated circuit or the circuit blocks included in the target integrated circuit, such as the design information of the target integrated circuit, the information on the circuit block corresponding to the placement position adjustment target, the connection relationship information between the circuit blocks, etc., in advance.

The placement information filtering unit 218 predicts a minimum substrate area required for placing the circuit blocks according to current generated placement information and when the predicted minimum substrate area does not correspond to a predetermined reference area range, the placement information filtering unit 218 may discard the generated placement information and request the placement information generation unit 216 to generate subsequent placement information. On the contrary, when the predicted minimum substrate area corresponds to the predetermined reference area range, the placement information filtering unit 218 may deliver the generated placement information to the EDA tool control unit 220.

As such, according to the present invention, placement information which does not satisfy a design condition is early discarded by predicting a substrate area which is enabled to be relatively quickly processed before performing the simulation through the EDA tool 300 in response to the generated placement information to reduce unnecessary time and cost required for the simulation and improve the quality of the layout design.

The EDA tool control unit 220 provides the generated placement information to the EDA tool 300 when the predicted minimum substrate area corresponds to the reference area range to control the EDA tool 300 to measure at least one of the consumption power, the performance, and the area of the target integrated circuit through the simulation based on the generated placement position information. In this case, the EDA tool control unit 220 may control the EDA tool 300 to perform all measurements for the consumption power, the performance, and the area of the target integrated circuit, of course.

The first index generation unit 230 may be configured to generate at least one measurement value based index in response to at least one measurement value measured through the EDA tool 300. For example, the first index generation unit 230 may be configured to generate a consumption power index, a performance index, and an area index corresponding to measurement values of the consumption power, the performance, and the area measured by the EDA tool 300 as the measurement value based index.

In this case, the first index generation unit 230 may be configured to receive, from the EDA tool 300, a first measurement value for the consumption power of the target integrated circuit, a second measurement value for the performance such as a delay time or a computation speed of the target integrated circuit, and a third measurement value for the substrate area or a chip area of the target integrated circuit.

In addition, the first index generation unit 230 may be configured to generate a consumption power index acquired by normalizing the first measurement value, a performance index acquired by normalizing the second measurement value, and an area index acquired by normalizing the third measurement value.

The reward providing unit 240 may be configured to calculate a reward corresponding to the generated placement information based on the measurement value based index generated by the first index generation unit 230, and provide the calculated reward to the neural network model 100.

In an exemplary embodiment, the reward providing unit 240 may be configured to calculate the reward based on a first reward component acquired by applying a first weight to the consumption power index, a second reward component acquired by applying a second weight to the performance index, and a third reward component acquired by applying a third weight to the area index. The first to third weights may be set to various values by considering the design intention, the purpose, the applied environment, etc., of the target integrated circuit.

The optimization information storage unit 250 may be configured to associate, when measurement values measured through the EDA tool 300 satisfy a predetermined measurement value condition, the measurement values and the reward corresponding to the generated placement information with the generated placement information, and store the associated the measurement values and the reward, and the generated placement information as optimization information.

For example, the optimization information storage unit 250 may associate, when the measurement value for the consumption power of the target integrated circuit, the measurement value for the performance, and the measurement value for the area satisfy all a predetermined consumption power condition, a predetermined performance condition, and a predetermined area condition, respectively, the measurement values and the reward corresponding to the generated placement information with the generated placement information, and store the associated the measurement values and the reward, and the generated placement information.

Meanwhile, the placement information generation unit 216 may be configured to generate subsequent placement information by using the neural network model 100 when the number of placement information stored in the optimization information storage unit 250 is less than a predetermined reference number as described above.

As mentioned above, the control unit 205 of the integrated circuit layout optimizing system 200 may further include a heat source decision unit 260, a second index generation unit 270, a heat source distribution image generation unit 280, an optimization information output unit 290, etc.

The heat source decision unit 260 may be configured to select an element, a cell, or a circuit block generating heat at a predetermined reference temperature or higher upon an actual operation among the elements, the cells, or the circuit blocks included in the target integrated circuit, and decide the selected element, cell, or circuit block as the heat source of the target integrated circuit.

In an exemplary embodiment, the heat source decision unit 260 may be configured to decide the heat sources of the target integrated circuit by referring to a heat temperature list recording heat temperature information upon the actual operation for each element, for each cell, or for each circuit block. In this case, the heat temperature list may be prestored in the storage unit 203 of the integrated circuit layout optimizing system 200.

The second index generation unit 270 may be configured to place the decided heat sources on a virtual substrate according to the placement information and subdivide an entire area of the virtual substrate into unit areas of the same area to calculate an area ratio occupied by the decided heat sources for each unit area and generate a heat source distribution index of the target integrated circuit based on a degree of scattering of the area ratios calculated for each unit area.

In an exemplary embodiment, the second index generation unit 270 may also be configured to further calculate a mean distance between a reference heat source and the remaining heat sources selected among the heat sources placed on the virtual substrate, and generate the heat source distribution index based on the calculated mean distance and the degree of scattering.

Specifically, the second index generation unit 270 may be configured to place the element, the cell, or the circuit block decided as the heat source on the virtual substrate according to the placement information, subdivide the entire area of the virtual substrate into the unit areas of the same area, and calculate area ratios occupied by the heat sources for each unit area, i.e., an occupancy rate. In this case, the virtual substrate may correspond to an actual substrate required when implementing the target integrated circuit according to the placement information.

Next, the second index generation unit 270 may be configured to calculate the degree of scattering of all occupancy rates by setting the occupancy rate of the heat source calculated for each unit area as a variant. For example, the second index generation unit 270 may calculate the degree of scattering as in Equation 1 below.

$$\sigma = \sqrt{\sum_{k=1}^{n} p_k (x_k - \mu)^2} \qquad \text{[Equation 1]}$$

Here, $\sigma$ represents the degree of scattering of the heat source occupancy rate x, $x_k$ represents the heat source occupancy rate of a k-th unit area, $\mu$ represents a mean value of all occupancy rates, $p_k$ represents a probability that the heat source occupancy rate will be $x_k$, and n represents the number of unit areas.

For reference, as the degree of scattering, $\sigma$ has a smaller value, it may be indicated that the heat sources of the integrated circuit are evenly distributed throughout the substrate, and as the degree of scattering, $\sigma$ has a larger value, it may be indicated that the heat sources of the integrated circuit are concentrated on a partial area of the substrate.

The second index generation unit 270 may be configured to further calculate a mean distance between the reference heat source and the remaining heat sources selected among the heat sources placed on the virtual substrate. For example, the second index generation unit 270 may select a heat source showing a highest heat temperature or a heat source which is most vulnerable to a high temperature among the heat sources placed on the virtual substrate as the reference heat source, and calculate the mean distance between the reference heat source and the remaining heat sources. For example, the second index generation unit 270 may calculate the mean distance as in Equation 2 below.

$$m = \frac{1}{n-l}\sum_{k=1}^{n-l} d_k \qquad \text{[Equation 2]}$$

In Equation 2, m represents the mean distance between the reference heat source and the remaining heat sources, $d_k$ represents a shortest distance between the reference heat source and a k-th heat source, and n represent the total number of heat sources.

For reference, as the mean distance m has a smaller value, it may be indicated that an overheat possibility of the reference heat source will be the higher and as the mean distance m has a larger value, it may be indicated that the overheat possibility of the reference heat source will be the lower.

As a result, the second index generation unit 270 may generate the heat source distribution index corresponding to the placement information based on the calculated degree of scattering, $\sigma$ and mean distance m. For example, the second index generation unit 270 may calculate a scattering degree index and a mean distance index by normalizing each of the scattering degree $\sigma$ and the mean distance m, respectively, and calculate the heat source distribution index by combining values acquired by applying weights to the calculated scattering degree index and mean distance index, respectively.

The reward providing unit 240 may calculate the reward by combining first to third reward components calculated by the measurement value based indexes and a fourth reward component acquired by applying a fourth weight to the heat source distribution index. The fourth weight may be set to various values by considering the design intention, the purpose, the applied environment, etc., of the target integrated circuit.

Meanwhile, the heat source distribution image generation unit 280 may be configured to display an element image, a cell image, or a circuit block image corresponding to the element, the cell, or the circuit block decided as the heat source of the target integrated circuit on a virtual substrate image according to the current generated placement information, and display the images with different colors according to a heat temperature level of the heat source, and generate a heat source distribution image corresponding to the current generated placement information.

In this case, the optimization information storage unit 250 may be configured to associate the heat source distribution image with the current generated placement information, and further store the associated heat source distribution image and the current generated placement information. That is, the optimization information storage unit 250 may associate the reward generated in response to the current generated placement information and the heat source distribution image with the current generated placement information, and store the associated reward and heat source distribution image, and the current generated placement information as the optimization information.

The placement information generation unit 216 may be configured to generate subsequent placement information by using the neural network model 100 when the number of placement information stored in the optimization information storage unit 250 is less than the predetermined reference number.

The optimization information output unit 290 may be configured to output the optimization information stored in the optimization information storage unit 250 when the number of placement information stored in the optimization information storage unit 250 satisfies a predetermined reference number or a predetermined optimization time elapses. In this case, the optimization information output unit 290 may output an optimization information list in which the optimization information is listed based on the value of the reward.

In an exemplary embodiment, the optimization information output unit 290 may be configured to display circuit block images corresponding to the circuit blocks of the target integrated circuit, respectively on the virtual substrate image according to the placement information stored in the optimization information storage unit 250 and generate a layout image of the target integrated circuit corresponding to the stored placement information, and superimpose the heat source distribution image corresponding to the stored placement information on the generated layout image and further output the superimposed images.

Figure 4:
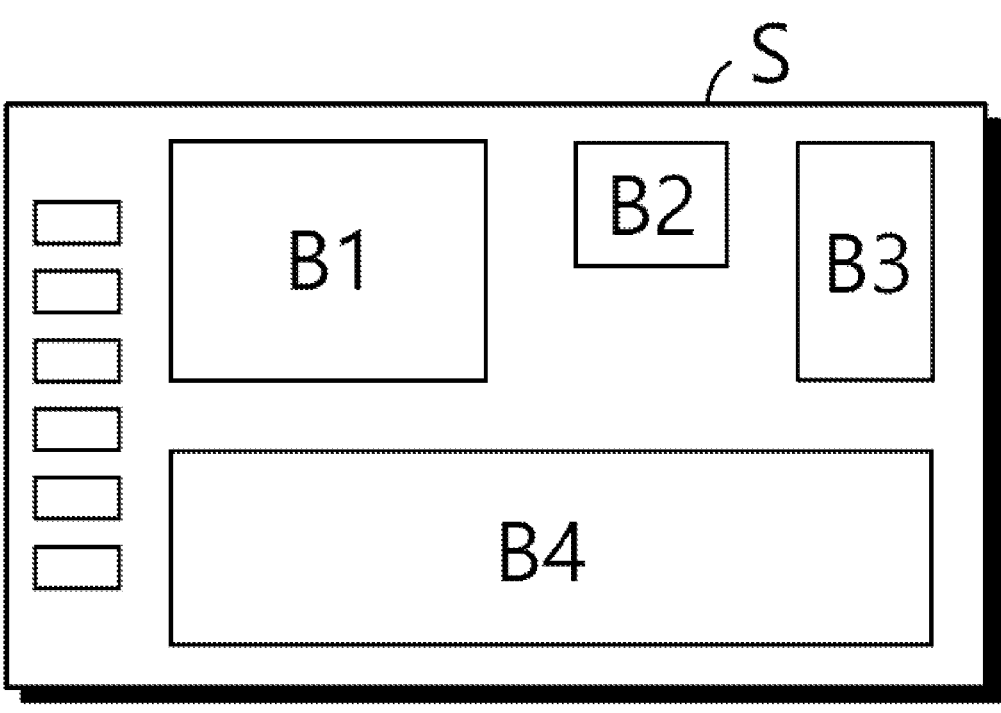
FIGS. 4 and 5 are diagrams illustrating an example of an integrated circuit placed and design in different forms according to an action of a neural network model.
Figure 5:
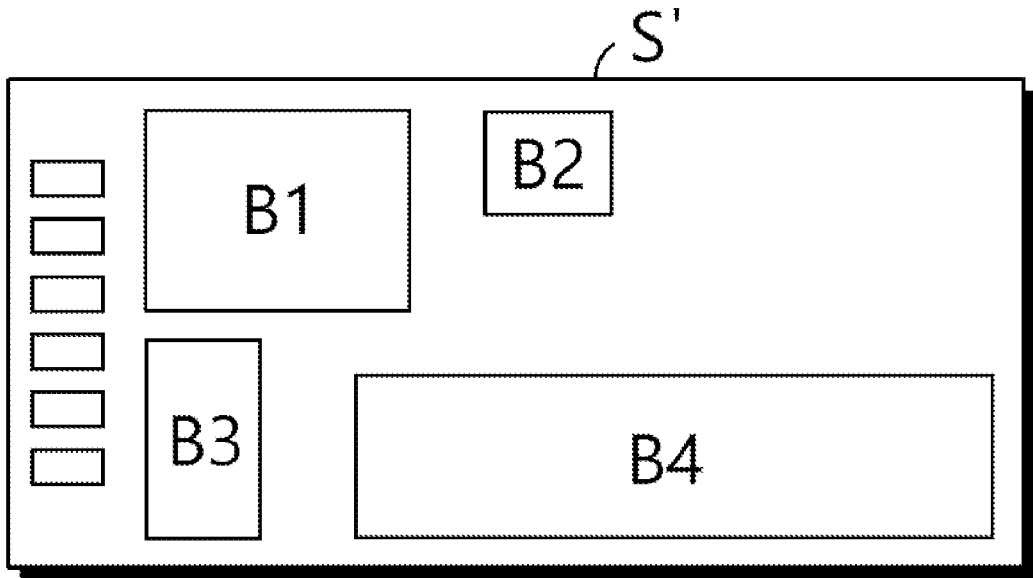

FIGS. 4 and 5 illustrate an example of an integrated circuit placed and design in different forms according to an action of a neural network model.

As illustrated in FIG. 4, the target integrated circuit may include multiple circuit blocks B1 to B4 corresponding to the placement position adjustment targets. The neural network model 100 may automatically place the circuit blocks B1 to B4. According to an automatic placement result of the neural network model 100, an area of a substrate S required for implementing the target integrated circuit may be changed.

For example, as illustrated in FIG. 5, the neural network model 100 may automatically place the circuit blocks B1 to B4 of the target integrated circuit in a different form from FIG. 4. As a result, an area of a substrate S' required for implementing the target integrated circuit is different from that of the substrate S illustrated in FIG. 4.

As such, when the placement form of the circuit blocks B1 to B4 is changed according to the automatic placement result of the neural network model 100, each of the consumption power property, the performance property, and the heat generation property of the target integrated circuit may also be changed in addition to the area of the substrate required for implementing the target integrated circuit. Therefore, the integrated circuit layout optimizing system 200 according to an exemplary embodiment of the present invention calculate the reward by considering all of the measurement value based indexes for the consumption power, the performance, and the area of the target integrated circuit, and the heat source distribution indexes in response to the automatic placement result of the neural network model 100, and provides the calculated reward to the neural network model 100 to reperform the reinforcement learning for the neural network model 100.

Figure 6:
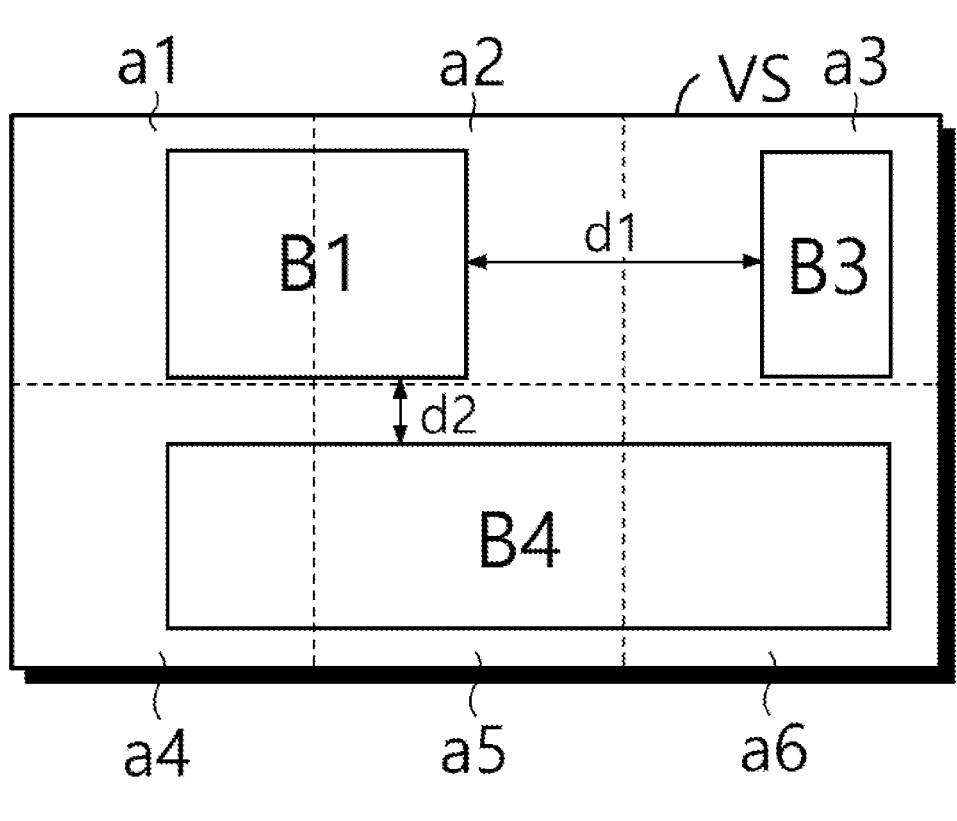
FIG. 6 is a diagram illustrating an example of a heat source placement state corresponding to the integrated circuit of FIG. 4.

FIG. 6 is a diagram illustrating an example of a heat source placement state corresponding to the integrated circuit of FIG. 4.

As illustrated in FIG. 6, the heat source decision unit 260 of the integrated circuit layout optimizing system 200 may decide circuit blocks B1, B3, and B4 generating heat of a reference temperature or more upon actual operating among the circuit blocks B1 to B4 included in the target integrated circuit as the heat source of the integrated circuit.

Next, the second index generation unit 250 places the heat sources B1, B3, and B4 on a virtual substrate VS according to the placement information and subdivides an entire area of the virtual substrate VS into unit area a1 to a6 of the same area to calculate an occupancy rate x which is an area ratio occupied by the heat sources B1, B3, and B4 for each unit area.

The second index generation unit 250 may calculate the scattering degree σ in the occupancy rates x1 to x6 by substituting the occupancy rates x1 to x6 calculated for unit area into Equation 1 above.

Meanwhile, the second index generation unit 250 may select a reference heat source B1 among the heat sources B1, B3, and B4 placed on the virtual substrate VS, and calculate shortest distances d1 and d2 between the reference heat source B1 and the remaining heat sources B3 and B4. In this case, the reference heat source B1 may correspond to a heat source showing the highest heat temperature or a heat source most vulnerable to the high temperature among the heat sources B1, B3, and B4. In addition, the second index generation unit 250 may calculate a mean distance m between the reference heat source B1 and the remaining heat sources B3 and B4 by substituting the calculated shortest distances d1 and d2 into Equation 2 above.

As a result, the second index generation unit 250 may generate the heat source distribution index corresponding to the placement information based on the calculated degree of scattering, σ and mean distance m.

Figure 7:
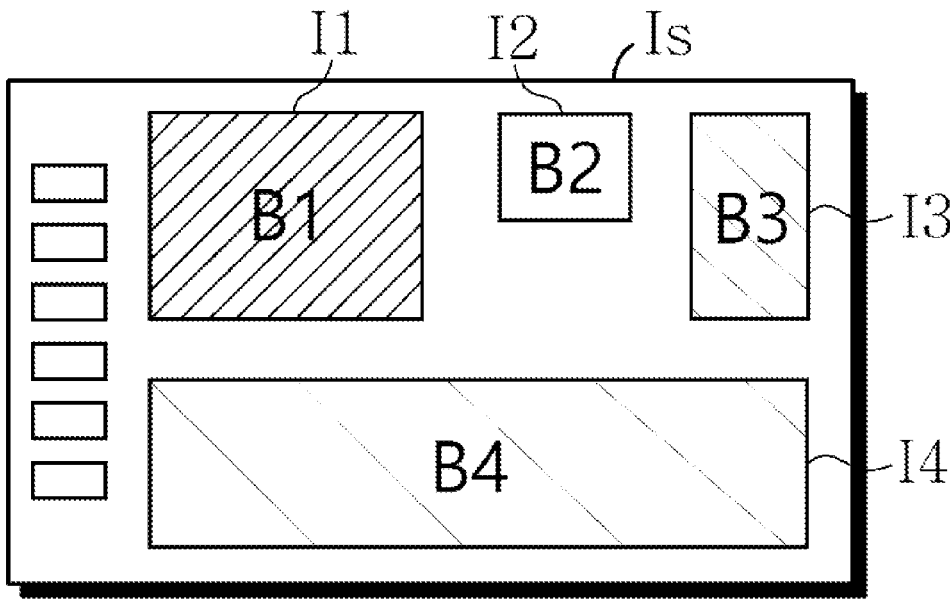
FIG. 7 is a diagram illustrating an example of a generated heat source distribution image according to the present invention.

FIG. 7 illustrates an example of a generated heat source distribution image according to the present invention.

As illustrated in FIG. 7, the heat source distribution image generation unit 280 of the integrated circuit layout optimizing system 200 displays circuit block images I1, I3, and I4 corresponding to the circuit blocks B1, B3, and B4 determined as the heat sources of the target integrated circuit on a virtual substrate image Is according to the current generated placement information, and displays the circuit block images I1, I3, and I4 with different colors according to the heat temperature level of the heat source generate to the heat source distribution image corresponding to the current generated placement information.

The optimization information output unit 290 may display the circuit block images corresponding to the circuit blocks of the target integrated circuit, respectively on the virtual substrate image according to the current generated placement information and generate the layout image of the target integrated circuit, and superimpose the heat source distribution image on the generated layout image and output the superimposed images. As a result, as the output images, the images I1, I3, and I4 of the circuit blocks corresponding to the heat sources and an image I2 of a circuit block which does not correspond to the heat source may be displayed jointly.

Meanwhile, when the optimization information storage unit 250 subdivides the entire area of the virtual substrate VS illustrated in FIG. 6 into the unit area a1 to a6 of the same area, optimization information storage unit 250 may rearrange the circuit blocks so that a mean value of RGB values of the heat source distribution images of the circuit blocks which are present in the respective unit area is present within a predetermined range. The mean value of the RGB values of the heat source distribution images may be replaced with ranges of the R value, the G value, and the B value being within a predetermined range.

Figure 8:
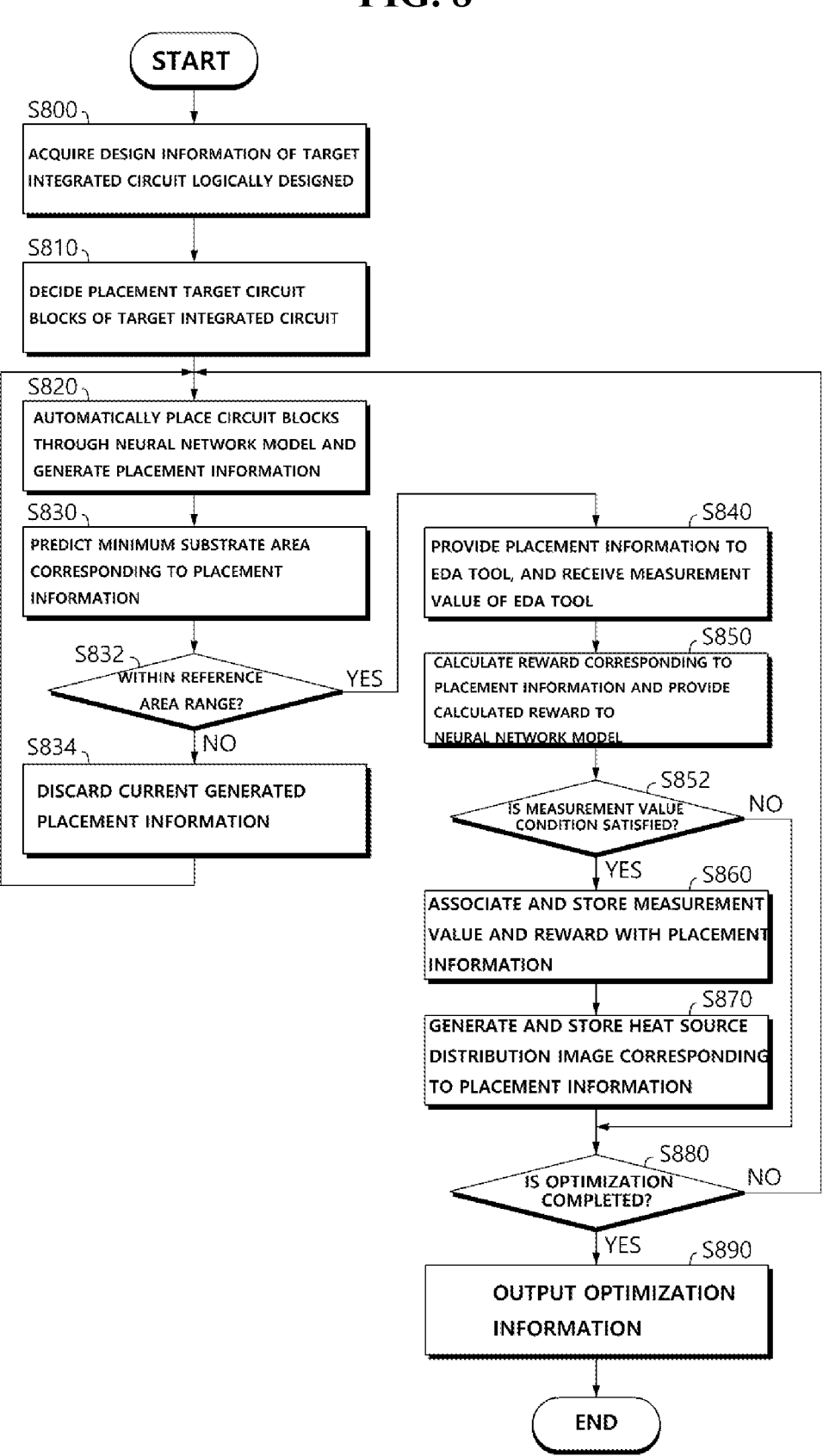
FIG. 8 is a flowchart illustrating a method for optimizing an integrated circuit layout according to an exemplary embodiment of the present invention.

FIG. 8 is a flowchart illustrating a method for optimizing an integrated circuit layout according to an exemplary embodiment of the present invention. Referring to FIG. 8, detailed operations of the integrated circuit layout optimizing system 200 corresponding to the computer system will be described in time series.

As illustrated in FIG. 8, first, the optimizing system 200 parses a netlist file of a target integrated circuit logically designed to acquire design information of the target integrated circuit (S800). In this case, the optimizing system 200 may receive the netlist file of the target integrated circuit from the user terminal 20 or the EDA tool 300.

Next, the optimizing system 200 may decide circuit blocks which correspond to the placement position adjustment target and each include at least one element or cell based on the acquired design information (S810). In this case, the circuit blocks of the target integrated circuit may be decided according to a physical criterion or a function criterion, or also decided according to setting of the user.

Next, the optimizing system 200 may control the neural network model 100 to automatically place the circuit blocks included in the target integrated circuit, and generate placement information indicating the placement positions of the circuit blocks automatically placed by the neural network model 100 (S820). To this end, the optimizing system 200 may provide, to the neural network model 100, information on states of the target integrated circuit or the circuit blocks included in the target integrated circuit, such as the design information of the target integrated circuit, the information on the circuit block corresponding to the placement position adjustment target, the connection relationship information between the circuit blocks, etc., in advance.

Next, the optimizing system 200 may predict a minimum substrate area required for placing the circuit blocks according to the current generated placement information (S830).

When the predicted minimum substrate area does not correspond to a predetermined reference area range (S832), the optimizing system 200 may discard the current generated placement information and generate subsequent placement information (S834).

On the contrary, when the predicted minimum substrate area corresponds to the predetermined reference area range, the optimizing system 200 may provide the current generated placement information to the EDA tool 300 and receive a measurement value measured by the EDA tool 300 (S840). In this case, the optimizing system 200 may control the EDA tool 300 to measure at least one consumption power, performance, and area of the target integrated circuit through a simulation based on current generated placement position information. According to an exemplary embodiment, the optimizing system 200 may control the EDA tool 300 to perform all measurements for the consumption power, the performance, and the area of the target integrated circuit, of course.

Next, the optimizing system 200 may generate at least one measurement value based index in response to the received measurement value, and calculate a reward corresponding to the placement information based on the measurement value based index and provide the calculated reward to the neural network model 100 (S850). A reward calculation process will be described below again with reference to FIG. 9.

Next, when the measurement values received from the EDA tool 300 satisfy a predetermined measurement value condition (S852), the optimizing system 200 may associate and store the measurement values and the reward with the current generated placement information as the optimization information (S860). For example, the optimizing system 200 may associate, when the measurement value for the consumption power of the target integrated circuit, the measurement value for the performance, and the measurement value for the area satisfy all a predetermined consumption power condition, a predetermined performance condition, and a predetermined area condition, respectively, the measurement values and the reward corresponding to the current generated placement information with the current generated placement information, and store the associated the measurement values and the reward, and the current generated placement information.

On the contrary, when the measurement values received from the EDA tool 300 do not satisfy the predetermined measurement value condition, the optimizing system 200 may not store the information, but generate the subsequent placement information again to repeat steps S820 to S850.

Meanwhile, the optimizing system 200 may display an element image, a cell image, or a circuit block image corresponding to the element, the cell, or the circuit block decided as the heat source of the target integrated circuit on a virtual substrate image according to the current generated placement information, and display the images with different colors according to a heat temperature level of the heat source, and generate a heat source distribution image corresponding to the current generated placement information, and associate and further store the generated heat source distribution image with the current generated placement information (S870). That is, the optimizing system 200 may associate the reward generated in response to the current generated placement information and the heat source distribution image with the current generated placement information, and store the associated reward and heat source distribution image, and the current generated placement information as the optimization information.

Next, since the number of placement information stored in the optimizing system 200 is less than a predetermined reference number, the optimizing system 200 may generate the subsequent placement information and repeat the steps S820 to S870 again before completing an optimization process (S880).

On the contrary, when the number of placement information stored in the optimizing system 200 satisfies the predetermined reference number, or a predetermined optimization time elapses and the optimization process is thus completed, the optimizing system 200 may output stored optimization information (S890). In this case, the optimizing system 200 may output an optimization information list in which the optimization information is listed based on the value of the reward.

In an exemplary embodiment, the optimizing system 200 may display circuit block images corresponding to the circuit blocks of the target integrated circuit, respectively on the virtual substrate image according to the stored placement information and generate a layout image of the target integrated circuit corresponding to the stored placement information, and superimpose the heat source distribution image corresponding to the stored placement information on the generated layout image and further output the superimposed images.

The optimizing system 200 may subdivide the entire area of the virtual substrate into the unit area of the same area, and reflect rearranging the circuit blocks so that the mean value of RGB values of the heat source distribution images of the circuit blocks which are present in the respective unit area is present within a predetermined range to the optimization information.

FIG. 9 is a flowchart illustrating a reward calculation process of a method for optimizing an integrated circuit layout according to an exemplary embodiment of the present invention.

As illustrated in FIG. 9, the optimizing system 200 may generate at least one measurement value based index in response to at least one measurement value measured through the EDA tool 300 (S900).

For example, the optimizing system 200 may generate a consumption power index, a performance index, and an area index corresponding to measurement values of the consumption power, the performance, and the area measured by the EDA tool 300 as the measurement value based index.

In this case, the optimizing system 200 may receive, from the EDA tool 300, a first measurement value for the consumption power of the target integrated circuit, a second measurement value for the performance such as a delay time or a computation speed of the target integrated circuit, and a third measurement value for the substrate area or a chip area of the target integrated circuit. In addition, the optimizing system 200 may generate a consumption power index acquired by normalizing the first measurement value, a performance index acquired by normalizing the second measurement value, and an area index acquired by normalizing the third measurement value.

In an exemplary embodiment, the optimizing system 200 may calculate the reward corresponding to the current generated placement information based on only the measurement value based indexes, and provide the calculated reward to the neural network model 100. In this case, the optimizing system 200 may calculate the reward based on a first reward component acquired by applying a first weight to the consumption power index, a second reward component acquired by applying a second weight to the performance index, and a third reward component acquired by applying a third weight to the area index. The first to third weights may be set to various values by considering the design intention, the purpose, the applied environment, etc., of the target integrated circuit.

Next, the optimizing system 200 may select an element, a cell, or a circuit block generating heat at a predetermined reference temperature or higher upon an actual operation among the elements, the cells, or the circuit blocks included in the target integrated circuit, and decide the selected element, cell, or circuit block as the heat source of the target integrated circuit, and place the heat sources on the virtual substrate according to the current generated placement information (S910).

For example, the optimizing system 200 may decide the heat sources of the target integrated circuit by referring to a heat temperature list recording heat temperature information upon the actual operation for each element, for each cell, or for each circuit block. In this case, the heat temperature list may be prestored in the storage unit 203 of the integrated circuit layout optimizing system 200.

Next, the optimizing system 200 may subdivide the entire area of the virtual substrate into the unit area of the same area to calculate occupancy rates an area ratio occupied by the heat sources for each unit area (S920).

Next, the optimizing system 200 may calculate the scattering degree of the occupancy rates by substituting the occupancy rates calculated for each unit area into Equation 1 above (S930).

Meanwhile, the optimizing system 200 may select a reference heat source among the target heat sources, and calculate distance values representing shortest distances between the reference heat source and the remaining heat sources (S940). In this case, the optimizing system 200 may select a heat source showing the highest heat temperature or a heat source most vulnerable to the high temperature among the heat sources of the target integrated circuit as the reference heat source.

Next, the optimizing system 200 may calculate a mean distance between the reference heat source and the remain-ing heat sources by substituting the calculated distance values into Equation 2 above (S950).

Next, the optimizing system 200 may generate the heat source distribution index corresponding to the placement information based on the calculated degree of scattering and mean distance (S960). In this case, the optimizing system 200 may calculate a scattering degree index and a mean distance index by normalizing each of the scattering degree and the mean distance, respectively, and calculate the heat source distribution index by combining values acquired by applying weights to the calculated scattering degree index and mean distance index, respectively.

Next, the optimizing system 200 may calculate the reward corresponding to the current generated placement information by combining a first reward component acquired by applying a first weight to the consumption power index, a second reward component acquired by applying a second weight to the performance index, a third reward component acquired by applying a third weight to the area index, and a fourth reward component acquired by applying a fourth weight to the heat source distribution index. The first to fourth weights may be set to various values by considering the design intention, the purpose, the applied environment, etc., of the target integrated circuit.

On the other hand, the exemplary embodiments according to the present invention may be implemented as a computer system and a computer program that drives the computer system. When the exemplary embodiments of the present invention are implemented as the computer program, the components of the present invention may include program segments that execute the operation or task through that computer system. The computer program or program segments may be stored in various computer-readable recording media. The computer-readable recording media may include all types of media having data which may be read by the computer system recorded therein. For example, the computer-readable recording media may include a ROM, a RAM, an EEPROM, a register, a flash memory, a CD-ROM, a magnetic tape, a hard disk, a floppy disk, an optical data recording device, etc. Further, the recording media are distributively arranged in computer systems connected by various networks to store or execute program codes in a distribution scheme.

As described above, according to the present invention, placement information is generated by automatically placing circuit blocks included in a design target integrated circuit through a neural network model learned based on a rein-forcement learning algorithm, and a simulation result corresponding to the placement information is provided jointly with the placement information in link with an EDA tool to reduce time and cost for optimizing an integrated circuit layout design and provide a layout design having a constant quality regardless of an ability of an engineer.

A minimum substrate area required for placing the circuit blocks according to the placement information is preferen-tially predicted before performing a simulation correspond-ing to the placement information through the EDA tool, and the placement information is discarded and subsequent placement information is generated when the minimum substrate area does not correspond to a predetermined ref-erence area range to reduce unnecessary time and cost required for the simulation and improve the quality of the layout design.

Reinforcement learning for the neural network model is reperformed by a method of calculating and providing a reward considering all of consumed power, performance, and an area of a target integrated circuit in response to an action of the neural network model to provide a layout design which satisfies all of a consumed power property, a performance property, and an area property required according to the design intention, purpose, or applied environment of the integrated circuit, and further improve the quality of the layout design.

The reward provided to the neural network model is calculated by reflecting distribution states of elements, cells, or circuit blocks corresponding to a heat source of the target integrated circuit to provide a layout design which fundamentally alleviates a heat generation phenomenon of the integrated circuit.

The exemplary embodiments according to the present invention can solve other technical problems other than the contents mentioned herein in the relevant technical field as well as the relevant technology field.

So far, the present invention has been explained by referring to specific exemplary embodiments. However, it will be clearly appreciated by those skilled in the art that various modified exemplary embodiments can be implemented in the technical scope of the present invention. Therefore, the disclosed embodiments should be considered in an illustrative viewpoint rather than a restrictive viewpoint. That is, the scope of the technical spirit of the present invention is shown in the claims, and all differences within the scope of equivalents thereof should be construed as being included in the present invention.

What is claimed is:

1. A system for optimizing an integrated circuit layout based on a neural network which interlocks with an electronic design automation (EDA) tool, the system comprising:

a design information acquisition unit parsing a netlist file of a target integrated circuit and acquiring design information of the target integrated circuit;

a circuit block decision unit deciding circuit blocks which correspond to a placement position adjustment target and each includes at least one element or cell based on the design information;

a placement information generation unit generating first placement information indicating placement positions of the circuit blocks by using a neural network model learned to automatically place the circuit blocks based on a reinforcement learning algorithm;

a placement information filtering unit predicting a minimum substrate area required for placing the circuit blocks according to the first placement information and when the predicted minimum substrate area does not correspond to a predetermined reference area range, discarding the first placement information and requesting the placement information generation unit to generate second placement information;

an EDA tool control unit providing the first placement information to the EDA tool when the predicted minimum substrate area corresponds to the reference area range, and controlling the EDA tool to measure consumption power, performance, and an area of the target integrated circuit based on the first placement information;

a first index generation unit generating a consumption power index, a performance index, and an area index based on measurement values for the consumption power, performance, and area of the target integrated circuit, which are measured through the EDA tool; and a reward providing unit calculating a reward corresponding to the first placement information based on a first reward component acquired by applying a first weight to the consumption power index, a second reward component acquired by applying a second weight to the performance index, and a third reward component acquired by applying a third weight to the area index, and providing the calculated reward to the neural network model.

2. The system of claim 1, further comprising:

an optimization information storage unit associating, when the measurement value for the consumption power of the target integrated circuit measured through the EDA tool, the measurement value for the performance, and the measurement value for the area all satisfy a predetermined consumption power condition, a predetermined performance condition, and a predetermined area condition, respectively, the measurement values measured through the EDA tool and the reward corresponding to the first placement information with the first placement information, and storing the associated the measurement values and the reward, and the first placement information.

3. The system of claim 2, wherein the placement information generation unit is configured to generate the second placement information by using the neural network model when a number of the first placement information stored in the optimization information storage unit is less than a predetermined reference number.

4. A method for optimizing an integrated circuit layout based on a neural network performed by a computer system which interlocks with an electronic design automation (EDA) tool, the method comprising:

step A of parsing a netlist file of a target integrated circuit and acquiring design information of the target integrated circuit;

step B of deciding circuit blocks which correspond to a placement position adjustment target and each includes at least one element or cell based on the design information;

step C of generating first placement information indicating placement positions of the circuit blocks by using a neural network model learned to automatically place the circuit blocks based on a reinforcement learning algorithm;

step D of predicting a minimum substrate area required for placing the circuit blocks according to the first placement information and when the predicted minimum substrate area does not correspond to a predetermined reference area range, discarding the first placement information and generating second placement information by using the neural network model;

step E of providing the first placement information to the EDA tool when the predicted minimum substrate area corresponds to the reference area range, and controlling the EDA tool to measure consumption power, performance, and an area of the target integrated circuit based on the first placement information;

step F of generating a consumption power index, a performance index, and an area index based on measurement values for the consumption power, performance, and area of the target integrated circuit, which are measured through the EDA tool; and step G of calculating a reward corresponding to the first placement information based on a first reward component acquired by applying a first weight to the consumption power index the computer system, a second reward component acquired by applying a second weight to the performance index, and a third reward component acquired by applying a third weight to the area index, and providing the calculated reward to the neural network model.

5. The method of claim 4, further comprising:

step H of associating, when the measurement value for the consumption power of the target integrated circuit measured through the EDA tool, the measurement value for the performance, and the measurement value for the area all satisfy a predetermined consumption power condition, a predetermined performance condition, and a predetermined area condition, respectively in step E, the measurement values measured through the EDA tool and the reward corresponding to the first placement information with the first placement information, and storing the associated the measurement values and the reward, and the first placement information.

6. The method of claim 5, further comprising:

after step H, generating the second placement information by using the neural network model, and repeating steps D to H when a number of first placement information stored in the computer system is less than a predetermined reference number.

7. A non-transitory computer readable recording medium having a computer program for executing the method of claim 4, which is recorded therein.

\*    \*    \*    \*    \*